United States Patent [19]
Dembek et al.

[11] Patent Number: 5,350,832
[45] Date of Patent: Sep. 27, 1994

[54] TRANSITION METAL COMPLEXES OF POLYARYLENE OXIDES AND SULFIDES

[75] Inventors: Alexa A. Dembek, Wilmington, Del.; Marianne Marsi, Washington, W. Va.

[73] Assignee: E. I. Du Pont de Nemours and Company, Wilmington, Del.

[21] Appl. No.: 990,201

[22] Filed: Dec. 14, 1992

[51] Int. Cl.$^5$ .............................................. C08G 75/16
[52] U.S. Cl. ........................................ 528/373; 528/9; 528/86; 528/166; 528/219; 528/374
[58] Field of Search ...................... 528/9, 86, 166, 219, 528/373, 374

[56] References Cited
PUBLICATIONS

J. A. Segal, J. Chem. Soc., Chem. Commun., vol. 198, pp. 1338–1339 Jun. (1985).
A. Alemagna, et al., J. Org. Chem., vol. 48 Sep. (1983).
D. Astruc in Tet. Lett., vol. 39 (1983) a p. 4069.
R. M. Moriarty, et al., J. Organometal. Chem., vol. 350 Aug. (1988) at p. 173.

*Primary Examiner*—John Kight, III
*Assistant Examiner*—Shelley A. Dodson

[57] ABSTRACT

Polyarylene oxides and sulfides which are $\pi$-arene complexed with transition metals are disclosed. Also disclosed is a process for making a polyarylene sulfide by reaction of a $\pi$-arene complexed arylene dihalide with the dianion of an arylene dithiol. The complexed polymers are soluble in common organic solvents, and the polymer solutions can be used to make films and coatings or to encapsulate parts.

8 Claims, No Drawings

TRANSITION METAL COMPLEXES OF POLYARYLENE OXIDES AND SULFIDES

FIELD OF THE INVENTION

Disclosed are selected transition metal complexes of polyarylene oxides and sulfides which are made by the reaction of a transition metal complex of an arylene dihalide with a salt of an aromatic diol or an aromatic dithiol. The resulting complexed polymers are soluble in organic solvents and can be used to prepare protective films.

TECHNICAL BACKGROUND

Aromatic dihalides form $\pi$-arene complexes with certain transition metal groups such as $Cr(CO)_3$, $RuCp^{*+}(Cp^+$ is pentamethylcyclopentadiene) and $FeCp^+$ (Cp is cyclopentadiene). The $\pi$-arene complexes sometimes survive when the aromatic dihalide is reacted.

J. A. Segal, J. Chem. Soc., Chem. Commun., Vol. 198, p. 1338-1339 (1985) reports that p-dichlorobenzene complexed with $RuCp^+$ $PF_6^-$ can be reacted with the sodium or potassium salts of bisphenol A or his (4-hydroxyphenyl) ketone to form ruthenium complexed PEEK or polyether of bisphenol A and hydroquinone. No mention is made of forming polymers containing sulfur or of polymers in which ether linkages connect all the arylene groups.

A. Alemagna, et al., J. Org. Chem., Vol. 48 (1983), p. 3114-3116 report the reaction of chromium complexed arylene dihalides with thiols. Similarly, D. Astruc in Tet. Lett., Vol. 39 (1983) at p. 4069 reports the reaction of an iron complexed aryl halide with a phenyl thiolate anion. Ruthenium complexes of aryl halides are similarly reported to react with thiols in R. M. Moriarty, et al., J. Organometal. Chem., Vol. 350 (1988) at p. 173. However, these references do not report polymer formation.

SUMMARY OF THE INVENTION

This invention concerns a transition metal complexed polymer comprising repeat units of the formula

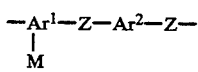

wherein:
each $Ar^1$ and $Ar^2$ is independently arylene;
M is an iron, chromium, manganese or ruthenium moiety capable of forming a $\pi$-arene complex with $Ar^1$; and
each Z is independently oxygen or sulfur.

This invention also concerns a process for the production of a transition metal complexed polyarylene sulfide, comprising, contacting in solution an arylene dihalide $\pi$-arene complex with a transition metal containing moiety, with a dianion of the formula —S—Ar$^1$—S—, wherein $Ar^1$ is arylene.

DETAILS OF THE INVENTION

This invention concerns polymers and a process for making some of those polymers wherein there are arylene groups. By an "arylene group" herein is meant a group with two free valencies to aromatic carbon atoms which contains one or more carbocyclic aromatic rings. If more than one ring is present, such zings are fused together and/or connected by a covalent bond. In all of the arylene compounds herein, it is preferred if the "free" valencies are not ortho to each other. Preferred arylene groups herein are phenylene, biphenylene, and naphthylene. Especially preferred groups are 1,4-phenylene and 4,4'-biphenylene. Most preferred is 1,4-phenylene. Another preferred arylene group is one in which the free valencies are linear or colinear with respect to one another.

Preferred iron, chromium and ruthenium moieties which form a $\pi$-arene complex with arylene dihalides and polyarylene oxides and sulfides are $Cr(CO)_3$, $RuCp^*X$, $RuCpX$, $FeCp^*X$, $FeCpX$, and $Mn(CO)_3X$, wherein X is an anion. Preferred moieties are $Cr(CO)_3$, $RuCpX$, $FeCp^*X$ $RuCp^*X$ and $FeCpX$. An especially preferred moiety is $RuCp^*X$. The choice of the anion, X, is not critical $\pi$-Arene complexes of iron, ruthenium and chromium are known, see for example: R. P. A. Sneeden, Organochromium Compounds, Academic Press, New York, 1975, p.19-20 and other portions of this S. G. Davies, Organotransition Metal Chemistry Applications to Organic Synthesis, Pergamon Press, 1982, p. 68-72; and R. M. Moriarty, et. al., J. Organometal. Chem., Vol. 350, (1958), p. 157-190.

In those $\pi$-arene complexes herein that contain anions, it is preferred that the anions be relatively nonnucleophilic. Such anions are usually the anions of strong conjugate acids in which the negative charge can be delocalized over more than one atom. Suitable anions include hexafluorophosphate, triflate (trifluoromethanesulfonate), tetraphenylborate, and chloride.

In the polymerization process claimed herein, a transition metal $\pi$-arene complex of an arylene dihalide is reacted with an alkali metal salt of the dianion of dihydroxy aromatic compound (a diphenol) or an arylene dithiol, or with a compound containing an arylene group which is bonded to one thiol and one hydroxy group [this would give a repeat unit containing both sulfur and oxygen in the main polymer chain, i.e., a poly(etherthioether) ]. Both the diphenol and dithiol (and their alkali metal salts) contain an arylene group, and preferred arylene groups are as described above.

An arylene dihalide is also used, and preferred arylene groups for this compound are also as described above. Preferred halogens in the arylene dihalide are fluorine and chlorine. Chlorine is especially preferred. Thus, the preferred starting materials for the polymerization process will be those diphenols, arylene dithiols and dihalides that correspond to the combination of the above arylene groups with 2 hydroxy groups or 2 thiol groups or 2 halogen atoms. The most preferred diphenol is hydroquinone, the most preferred dithiol is 1,4-benzenedithiol and the most preferred arylene dihalide is 1,4-dichlorobenzene. Other preferred starting materials (and repeat units derived from them) will be apparent to the art skilled, by similar combination of preferred arylene groups and —OH, —SH and halogens. Preferred alkali metals for the salts of the dithiol or diphenol are sodium and potassium.

The polymerization process is carried out in solution. Preferred solvents are aprotic solvents with relatively high polarity such as dimethylsulfoxide (DMSO), N,N-dimethylformamide (DMF), N-methylpyrrlidone (NMP) and N,N-dimethylacetamide (DMAC). Although the temperature is not critical, the polymerization can be carried out at about 25° C. to about 80° C., wherein convenient polymerization rates are obtained, and under which little decomposition of the starting materials and/or product occurs. Mild agitation is preferred to mix the ingredients. Where the starting materials and/or polymer product are sensitive to oxygen and/or water, it is convenient to carry out the reaction under an inert gas such as nitrogen or argon.

The complexed polymers produced by this process are usually soluble in aprotic polar organic solvents such as DMSO, DMF, NMP and DMAC. Many of the uncomplexed polymers such as polyphenylene oxide and polyphenylene sulfide are not soluble in common organic solvents. Therefore, the use of the soluble transition metal complexes allows these polymers to be used for encapsulating parts such as electronic boards by dipping, and to be used for known processes for making films and coatings from these polymers. In the uncomplexed form these polymers are difficult or impossible to use in such ways. Such encapsulants, films and coatings, particularly in the uncomplexed from (the π-arene complex is decomposed for example) have good thermal stability and are solvent resistant.

It is believed that the uncomplexed polymers can be obtained from the complexed polymers by a variety of methods. For ruthenium and iron complexes, methods described by J. A. Segal, supra, which is hereby included by reference, can be used. Chromium carbonyl π-arene complexes may be decomposed by heating to about 250° C. or more, by exposure to iodine (preferably in solution), or by heating in pyridine at 115° C. for about 2 days.

The following abbreviations are used in the examples:

| | |
|---|---|
| Cp* | pentamethylcyclopentadiene |
| DCB-Ru | (1,4-dichlorobenzene)RuCp*, SO₃CF₃ |
| DCB-Fe | (1,4-dichlorobenzene)FeCp, PF₆ |
| DMSO | dimethylsulfoxide |
| DMF | N,N-dimethylformamide |

EXAMPLE 1

Synthesis of Ru complexed Poly(phenylene sulfide)

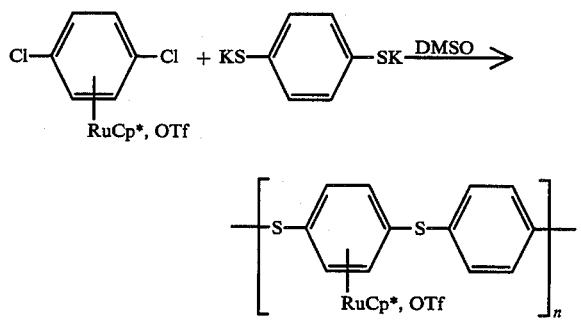

In a nitrogen flushed glove box, DCB-Ru (1.00 g, 1.88 mmol) and dipotassium 1,4-benzenedithiol (0.410 g, 1.88 mmol) were charged into an oven dried 10 mL flask equipped with a stirring bar. Anhydrous DMSO (3.00 g) was weighed into a vial, and this was the total quantity of solvent used for the polymerization (ca. 32% solids). The DMSO was added to the solid reagents, and the reaction was allowed to stir at 60°–265° C. for 2 h. The viscous tan colored solution was diluted with DMSO (ca. 3 mL), and the polymer was isolated and purified by precipitation into water. After filtration, the polymer was dried in a vacuum oven at 75°–85° C. for at least 2 h.

Characterization ¹H NMR (d₆-DMSO) 7.59 (s, 4H, Ar H), 6.10 (s, 4H, arene), 1.92 (s, 15H, CH₃) ppm; ¹³C NMR (d₆-DMSO) 133.3, 132.1, 100.4, 97.1, 88.7, 9.5 ppm. Inherent viscosity (0.5%, DMF, 30° C.): 1.21 dL/g. Anal. Calcd for C₂₃H₂₃O₃S₃F₃Ru: C, 45.91, H, 4.07. Found: C, 45.08; H, 3.91.

EXAMPLE 2

Synthesis of Ru complexed Poly(biphenylene sulfide)

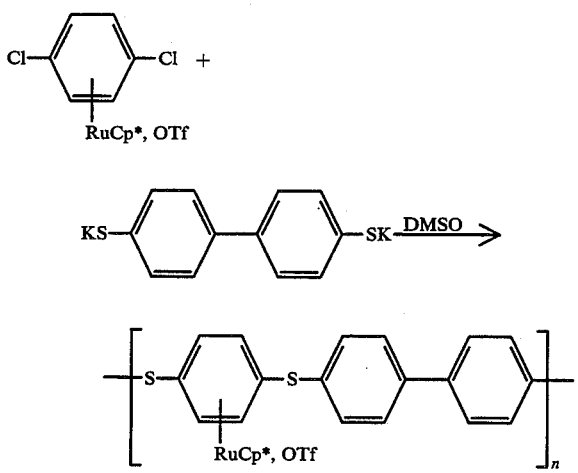

In a nitrogen flushed glove box, DCB-Ru (0.30 g, 0.564 mmol) and dipotassium 4,4'-biphenyldithiol (0.166 g, 0.564 mmol) were charged into an oven dried 10 mL flask equipped with a stirring bar. Anhydrous DMSO (1.09 g) was weighed into a vial, and this was the total quantity of solvent used for the polymerization (ca. 30% solids). The DMSO was added to the solid reagents, and the reaction was allowed to stir at 60°–65° C. for 2 h. The viscous solution was diluted with DMSO (ca. 2 mL), and the polymer was isolated and purified by precipitation into water. After filtration, the polymer was dried in a vacuum oven at 75°–85° C. for at least 24 h.

Characterization ¹H NMR (d₆-DMSO) 7.83 (d, 4H, J=8.1 Hz, Ar H), 7.63(d, 4H, J=8.0 Hz, Ar H), 6.06 (s, 4H, arene), 1.92 (s, 15H, CH₃) ppm; ¹³C NMR (d₆-DMSO) 139.4, 133.4, 130.1, 128.1, 101.9, 96.8, 87.9, 9.5 ppm. Inherent viscosity (0.5%, DMF, 30° C.): 1.38 dL/g. Anal. Calcd for C₂₉H₂₇O₃S₃F₃Ru: C, 51.39, H, 4.02. Found: C, 50.53; H, 4.11.

EXAMPLE 3

Synthesis of Ru complexed Poly(phenylene oxide)

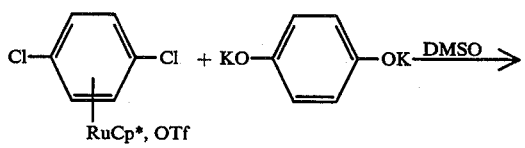

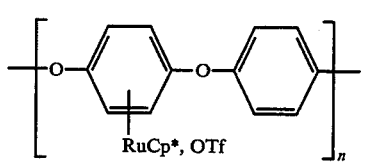

In a nitrogen flushed glove box, DCB-Ru (0.30 g, 0.564 mmol) and dipotassium 1,4-dihydroxybenzene (0.105 g, 0.564 mmol) were charged into an oven dried 10 mL flask equipped with a stirring bar. Anhydrous DMSO (0.95 g) was weighed into a vial, and this was the total quantity of solvent used for the polymerization (ca. 30% solids). The DMSO was added to the solid reagents, and the reaction was allowed to stir at 60°–65° C. for 2 h. The viscous solution was diluted with DMSO (ca. 2 mL), and the polymer was isolated and purified by precipitation into water. After filtration, the polymer was dried in a vacuum oven at 75°–85° C. for at least 24 h.

Characterization $^1$H NMR (d$_6$-DMSO) 7.29 (s, 4H, Ar H), 6.13 (s, 4H, arene), 1.97 (s, 15H, CH3) ppm; $^{13}$C NMR (d$_6$-DMSO) 151.7, 127.0, 120.9, 96.3, 78.7, 9.8 ppm. Inherent viscosity (0.5% , DMF, 30° C.): 0.81 dL/g. Anal. Calcd for C$_{23}$H$_{23}$O$_5$SF$_3$Ru: C, 48.50, H, 4.07. Found: C, 47.41; H, 4.09.

EXAMPLE 4

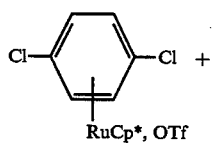

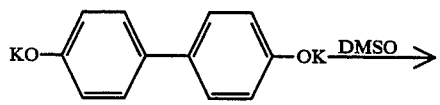

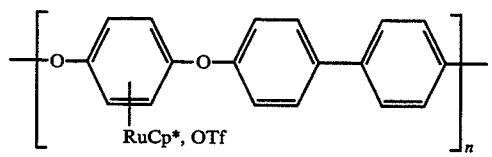

In a nitrogen flushed glove box, DCB-Ru (0.30 g, 0.564 mmol) and dipotassium 4,4'-dihydroxybiphenyl (0.148 g, 0.564 mmol) were charged into an oven dried 10 mL flask equipped with a stirring bar. Anhydrous DMSO (1.07 g) was weighed into a vial, and this was the total quantity of solvent used for the polymerization (ca. 30% solids). The DMSO was added to the solid reagents, and the reaction was allowed to stir at 60°–65° C. for 2 h. The viscous solution was diluted with DMSO (ca. 2 mL), and the polymer was isolated and purified by precipitation into water. After filtration, the polymer was dried in a vacuum oven at 75°–85° C. for at least 24 h.

Characterization $^1$H NMR (d$_6$-DMSO) 7.79 (d, 4H, J=8.5 Hz, Ar H), 7.30 (d, 4H, J=8.6 Hz, Ar H), 6.18 (s, 4H, arene), 2.00 (s, 15H, CH3) ppm; $^{13}$C NMR (d$_6$-DMSO) 154.6, 135.8, 128.4, 126.7, 119.2, 96.3, 79.1, 9.8 ppm. Inherent viscosity (0.5%, DMF, 30° C.): 1.19 dL/g. Anal. Calcd for C$_{29}$H$_{27}$O$_5$SF$_3$Ru: C, 53.95, H, 4.21. Found: C, 53.09; H, 4.28.

EXAMPLE 5

Synthesis of Fe complexed Poly(phenylene sulfide)

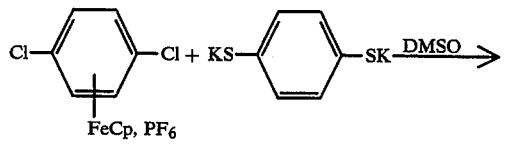

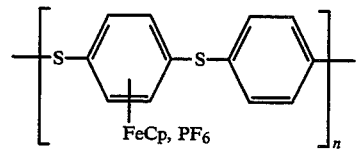

In a nitrogen flushed glove box, DCB-Fe (0.350 g, 0.848 mmol) and dipotassium 1,4-benzenedithiol (0.185 g, 0.848 mmol) were charged into an oven dried 10 mL flask equipped with a stirring bar. Anhydrous DMSO (1.10 g) was weighed into a vial, and this was the total quantity of solvent used for the polymerization (ca. 32.7% solids). The DMSO was added to the solid reagents, and the reaction was allowed to stir at room temperature for 2–3 h. The viscous brown colored solution was diluted with DMSO (ca. 2 mL), and the polymer was isolated and purified by precipitation into a mixed solvent system of water/methanol. After filtration, the polymer was dried in a vacuum oven at 75°–85° C. for at least 24 h.

Characterization $^1$H NMR (d$_6$-DMSO) 7.7 (br s, 4H, Ar H), 6.4 (br s, 4H, arene), 5.1 (br s, 5H, Cp) ppm; Inherent viscosity (0.5%, DMF, 30° C.): 0.42 dL/g.

EXAMPLE 6

Decomplexation of Ru complexed Poly(phenylene sulfide)

Method A.

A dilute d$_6$-DMSO solution of Ru complexed poly(phenylene sulfide) was heated at 150°–160° C. for 10–15 h. Decomplexation, monitored by $^1$H NMR, proceeded to ca. 60–70% and was coupled with precipitation of the insoluble product poly(phenylene sulfide).

Method B.

A dilute d$_5$-pyridine solution of Ru complexed poly(phenylene sulfide) was heated at 110°–115° C. for 20–25 h. Decomplexation, monitored by $^1$H NMR, proceeded to ca. 70–85% and was coupled with precipitation of the insoluble product poly(phenylene sulfide).

What is claimed is:

1. A transition metal complexed polymer consisting essentially of repeat units of the formula

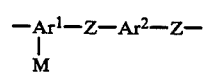

wherein:
each Ar$^1$ and Ar$^2$ is independently arylene, wherein arylene is a group with two free valencies to aromatic carbon atoms with contains one or more carbocyclic aromatic rings;

M is an iron, chromium, manganese or ruthenium moiety capable of forming a π-arene complex with $A^1$; and each Z is independently oxygen or sulfur.

2. The polymer as recited in claim 1 wherein Z is sulfur.

3. The polymer as recited in claim 1 wherein $Ar^1$ and $Ar^2$ are selected from the group consisting of phenylene, biphenylene and naphthylene.

4. The polymer as recited in claim 1 wherein $Ar^1$ and $Ar^2$ are selected from the group consisting of 1,4-phenylene and 4,4'-biphenylene.

5. The polymer as recited in claim 1 wherein $Ar^1$ and $Ar^2$ are 1,4-phenylene.

6. The polymer as recited in claim 1 wherein M is selected from the group consisting of $Cr(CO)_3$, Ru (pentamethylcyclopentadiene)X, Ru (cyclopentadiene)X, Fe (pentamethylcyclopentadiene)X; Fe (cyclopentadiene) X, and $Mn(CO)_3X$, wherein X is an anion.

7. The polymer as recited in claim 1 wherein M is selected from the group consisting of $Cr(CO)_3$, Ru(pentamethylcyclopentadiene)X, and Fe(cyclopentadiene)X, wherein X is an anion.

8. The polymer as recited in claim 5 wherein M is Ru(pentamethylcyclopentadiene)X, wherein X is an anion.

* * * * *